(12) United States Patent
Usami et al.

(10) Patent No.: US 9,748,204 B2
(45) Date of Patent: Aug. 29, 2017

(54) SEMICONDUCTOR DEVICE INCLUDING SEMICONDUCTOR CHIPS STACKED OVER SUBSTRATE

(71) Applicant: Micron Technology, Inc., Boise, ID (US)

(72) Inventors: Sensho Usami, Akita (JP); Koji Hosokawa, Akita (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/833,608

(22) Filed: Aug. 24, 2015

(65) Prior Publication Data

US 2016/0064358 A1 Mar. 3, 2016

(30) Foreign Application Priority Data

Aug. 28, 2014 (JP) .................. 2014-173687

(51) Int. Cl.
| | |
|---|---|
| *H01L 21/00* | (2006.01) |
| *H01L 25/065* | (2006.01) |
| *H01L 25/00* | (2006.01) |
| *H01L 23/00* | (2006.01) |
| *H01L 21/56* | (2006.01) |
| H01L 23/498 | (2006.01) |
| H01L 23/31 | (2006.01) |

(52) U.S. Cl.
CPC ........ *H01L 25/0657* (2013.01); *H01L 21/561* (2013.01); *H01L 24/09* (2013.01); *H01L 24/17* (2013.01); *H01L 24/32* (2013.01); *H01L 24/49* (2013.01); *H01L 24/73* (2013.01); *H01L 24/81* (2013.01); *H01L 24/83* (2013.01); *H01L 24/85* (2013.01); *H01L 24/92* (2013.01); *H01L 24/97* (2013.01); *H01L 25/50* (2013.01); *H01L 23/3128* (2013.01); *H01L 23/49816* (2013.01); *H01L 23/49838* (2013.01); *H01L 24/45* (2013.01); *H01L 2224/0401* (2013.01); *H01L 2224/04042* (2013.01); *H01L 2224/05554* (2013.01); *H01L 2224/0612* (2013.01); *H01L 2224/16227* (2013.01); *H01L 2224/32145* (2013.01); *H01L 2224/32225* (2013.01); *H01L 2224/45144* (2013.01);

(Continued)

(58) Field of Classification Search
CPC ...................................... H01L 23/48
See application file for complete search history.

(56) References Cited

U.S. PATENT DOCUMENTS 6,353,263 B1 3/2002 Dotta et al.
7,928,551 B2 4/2011 Fujiwara et al.
(Continued)

FOREIGN PATENT DOCUMENTS

JP 2000299431 A 10/2000
JP 2009099697 A 5/2009
(Continued)

*Primary Examiner* — William Harriston
(74) *Attorney, Agent, or Firm* — Perkins Coie LLP

(57) ABSTRACT

According to the present invention, a semiconductor device includes a substrate including a first surface and a second surface opposite to the first surface, a first layer formed over the first surface, a second layer thicker than the first layer formed over the first portion of the first layer, the first and second layers being formed of a same material, a first semiconductor chip mounted over a second portion of the first layer; and a second semiconductor chip commonly mounted over the first semiconductor chip and the second layer.

18 Claims, 13 Drawing Sheets

(52) U.S. Cl.
CPC .............. *H01L 2224/48091* (2013.01); *H01L 2224/48227* (2013.01); *H01L 2224/73203* (2013.01); *H01L 2224/73204* (2013.01); *H01L 2224/73253* (2013.01); *H01L 2224/73265* (2013.01); *H01L 2224/92125* (2013.01); *H01L 2224/92143* (2013.01); *H01L 2224/92247* (2013.01); *H01L 2224/97* (2013.01); *H01L 2225/0651* (2013.01); *H01L 2225/06517* (2013.01); *H01L 2225/06558* (2013.01); *H01L 2225/06562* (2013.01); *H01L 2225/06593* (2013.01); *H01L 2924/15311* (2013.01); *H01L 2924/181* (2013.01)

(56) References Cited

U.S. PATENT DOCUMENTS

| | | | |
|---|---|---|---|
| 2011/0089575 A1 | 4/2011 | Lee | |
| 2013/0025782 A1* | 1/2013 | Higo | ............... B32B 37/02 156/306.6 |
| 2013/0137217 A1 | 5/2013 | Kindo et al. | |
| 2013/0270717 A1* | 10/2013 | Ko | ............... H01L 25/105 257/777 |

FOREIGN PATENT DOCUMENTS

| | | |
|---|---|---|
| JP | 2009194189 A | 8/2009 |
| JP | 2011086943 A | 4/2011 |
| JP | 2013115190 A | 6/2013 |
| JP | 2014082302 A | 5/2014 |

* cited by examiner

FIG.5A

EMC Un-filling

| EMC | GAP Width [mm] | | | | | | | | | |
|---|---|---|---|---|---|---|---|---|---|---|
| | 0.2 | 0.4 | 0.6 | 0.8 | 1.0 | 1.2 | 1.4 | 1.6 | 2.0 |
| Resin A | 3/94 | 0/436 | 0/96 | 0/378 | 0/506 | 1/378 | 0/96 | 22/436 | 55/100 |
| Resin B | 48/96 | 0/432 | 0/96 | 0/378 | 2/206 | 2/378 | 2/96 | 8/428 | 40/100 |
| Resin C | 21/94 | 0/432 | 0/96 | 0/378 | 3/202 | 0/378 | 2/98 | 7/432 | 34/100 |

FIG.5B

Die Bending

| EMC | GAP Width [mm] | | | | | | | | | |
|---|---|---|---|---|---|---|---|---|---|---|
| | 0.2 | 0.4 | 0.6 | 0.8 | 1.0 | 1.2 | 1.4 | 1.6 | 2.0 |
| Resin A | 0/94 | 0/436 | 0/96 | 0/378 | 0/406 | 2/378 | 0/96 | 32/436 | 47/100 |
| Resin B | 0/94 | 0/432 | 0/96 | 0/378 | 3/206 | 3/378 | 3/96 | 39/428 | 28/100 |
| Resin C | 0/94 | 0/432 | 0/96 | 0/378 | 1/202 | 0/378 | 3/98 | 19/432 | 12/100 |

EMC Property

| EMC /Condition | Resin A | Resin B | Resin C |
|---|---|---|---|
| Filler size | Max53/ave9 | Max53/ave15 | Max55/ave9 |
| Filler volume | 87wt% | 86wt% | 85wt% |
| Spiral flow(cm) | 163 | 167 | 173 |
| Gel time (s) | 46 | 47 | 39 |
| Viscosity | 10.5 | 6.0 | 4.6 |

FIG.7

SEMICONDUCTOR DEVICE INCLUDING SEMICONDUCTOR CHIPS STACKED OVER SUBSTRATE

CROSS-REFERENCE TO RELATED APPLICATION

This application is based upon and claims the benefit of priority from Japanese Patent Application No. 2014-173687 filed on Aug. 28, 2014, the disclosure of which is incorporated herein in its entirety by reference.

BACKGROUND OF THE INVENTION

The present invention relates to a semiconductor device and, in particular, concerns a semiconductor device formed by stacking a plurality semiconductor chips, such as Dynamic Random Access Memories (DRAMs) or the like.

A semiconductor device of a Multi-Chip Package (MCP) configuration in which a semiconductor chip on an upper stage is stacked in a manner so as to overhang from a semiconductor chip on a lower stage has been known.

As a related technique, JP-A No. 2000-299431 has disclosed a technique in which an adhesive agent is placed on a wiring substrate and by flip-chip mounting a first semiconductor chip thereon, the adhesive agent is allowed to protrude the outside of the first semiconductor chip so that a protruded portion (overhang portion) of a second semiconductor chip is supported by the protruded adhesive agent.

Moreover, JP-A No. 2009-099697, JP-A No. 2009-194189 and JP-A No. 2011-086943 have disclosed a technique in which the overhang portion of the semiconductor chip on the upper stage is supported by bumps and wires.

Furthermore, JP-A No. 2013-115190 and JP-A No. 2014-082302 have disclosed a technique in which between the overhang portion of the semiconductor chip on the upper stage and the wiring substrate, an under fill or an NCP (Non-Conductive Paste) is placed.

It is supposed that the entire contents of the above-mentioned Patent Documents are incorporated and described in the present specification as quoted descriptions. The following analyses are carried out by the present inventors.

In recent years, together with miniaturization and thinness of portable apparatuses, miniaturization and thinness of a semiconductor device of the MCP configuration to be incorporated in the portable apparatuses have been achieved. For this reason, to make the chip thickness of the semiconductor chip thinner has been examined; however, the MCP in which the semiconductor chip on the upper stage is stacked so as to overhang from the semiconductor chip on the lower stage has caused the following problems.

(1) Since the thickness of the semiconductor chip on the lower stage becomes thinner, the gap between the overhang portion of the semiconductor chip on the upper stage and the wiring substrate also becomes narrower to deteriorate the filling property of a sealing resin. As a result, voids tend to be generated.

(2) Since the thickness of the semiconductor chip on the upper stage becomes thinner, the wire bonding property of the overhang portion of the semiconductor chip on the upper stage onto the electrode pads deteriorates. In other words, unjoined wires and chip cracking might occur. In the case when the amount of overhand is large, the risk of the overhang portion being pressed downward onto the substrate side by a pressure at the time of a molding process becomes higher. Moreover, since the overhang portion is lowered, the gap between the overhang portion and the wiring substrate is further narrowed. Furthermore, since the chip is lowered, the risk of chip cracking becomes higher. Since the chip is lowered, the wires are deflected, with the result that the risk of short-circuit with the adjacent wire becomes higher.

Additionally, in accordance with the technique described in JP-A No. 2000-299431, in a configuration where the semiconductor chip on the lower stage is mounted on the wiring substrate with its face up, when an attempt is made to form a supporting portion by the protruded adhesive agent, the protruded adhesive agent tends to run up onto the semiconductor chip on the lower stage, and might cover the electrodes of the semiconductor chip on the lower stage. When the chip thickness of the semiconductor chip on the lower stage is made thinner, the protruded adhesive agent more easily runs up onto the surface of the semiconductor chip on the lower stage. By the adhesive agent thus ran up thereon, the flatness of the semiconductor chip surface deteriorates, making it difficult to maintain good adhesiveness onto the semiconductor chip on the upper stage.

Moreover, in accordance with the technique in which the overhang portion of the semiconductor chip on the upper stage is supported by bumps and wires, disclosed by JP-A No. 2009-099697, JP-A No. 2009-194189 and JP-A No. 2011-086943, in the case when the semiconductor chip on the upper stage is thin, with the amount of overhang being large, a problem is raised in that a gap between the semiconductor chip on the upper stage and the supporting portion of the semiconductor chip on the lower stage tends to form a concave portion by a pressure at the time of molding. Consequently, the concave portion of the overhang portion might deteriorate the filling property of the sealing resin, or might generate chip cracking.

Furthermore, in accordance with the technique in which between the overhang portion of the semiconductor chip on the upper stage and the wiring substrate, an under fill or a Non-Conductive Paste (NCP) is placed, disclosed by JP-A No. 2013-115190 and JP-A No. 2014-082302, in the case when the semiconductor chip on the upper stage is thin, with the amount of overhang being large, before the under fill or the NCP has been filled and cured under the overhang portion, the overhang portion might be deflected to deteriorate the flatness. It is difficult to control the application area by the under fill or the NCP, and since it becomes further difficult when the semiconductor chip on the lower stage is thin, the application is basically made over the entire region of the overhang portion. Therefore, the running up onto the side faces of the semiconductor chip on the upper stage tends to occur, and in the case when the semiconductor chip on the upper stage is thin, the electrodes of the semiconductor chip on the upper stage might be covered with the under fill or the NCP that ran up thereon.

BRIEF DESCRIPTION OF THE DRAWINGS

FIGS. 5A and 5B are tables that indicate quality of a prototype of the semiconductor device in accordance with the first embodiment;

FIG. 7 is a table showing characteristics of materials and sealing resins used for the prototype of the semiconductor device in accordance with the first embodiment;

DETAILED DESCRIPTION OF THE EMBODIMENTS

Embodiment 1

Figure 1:
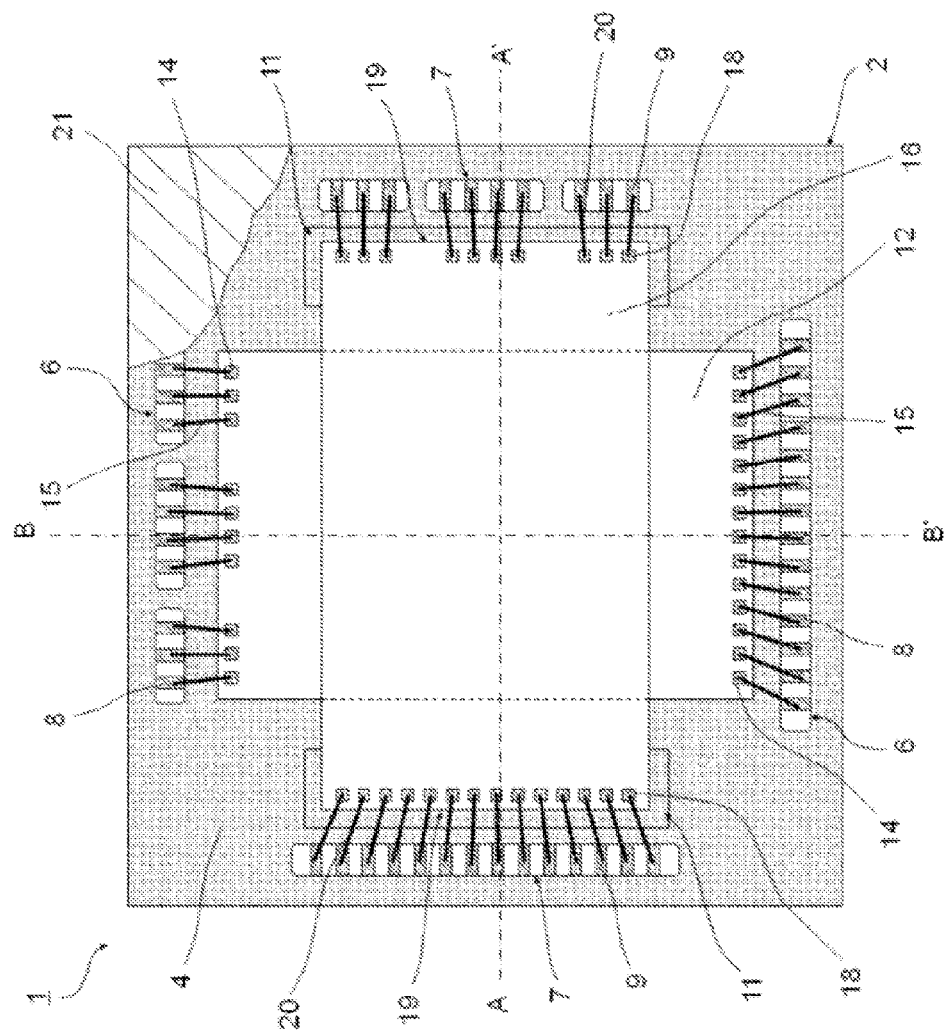
FIG. 1 is a plan view that schematically exemplifies a configuration of a semiconductor device in accordance with a first embodiment.

Referring to FIGS. 1-7, the following description will discuss a semiconductor device in accordance with a first embodiment in detail. FIG. 1 is a plan view showing a schematic configuration of a semiconductor device 1 in accordance with the present embodiment. FIGS. 2A and 2B show cross-sectional views that indicate cross-sectional configurations taken between A-A' as well as B-B' of FIG. 1.

Figure 2A:
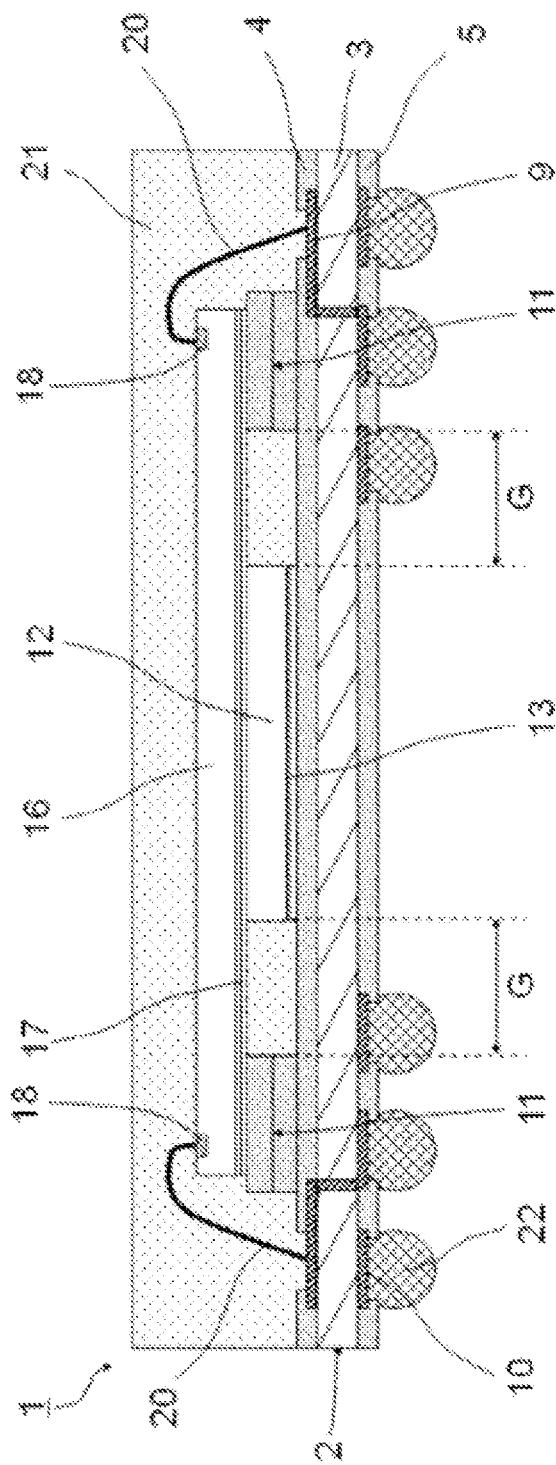
FIGS. 2A and 2B are cross-sectional views (taken along A-A' as well as B-B' of FIG. 1) that schematically exemplify the configuration of the semiconductor device in accordance with the first embodiment.
Figure 2B:
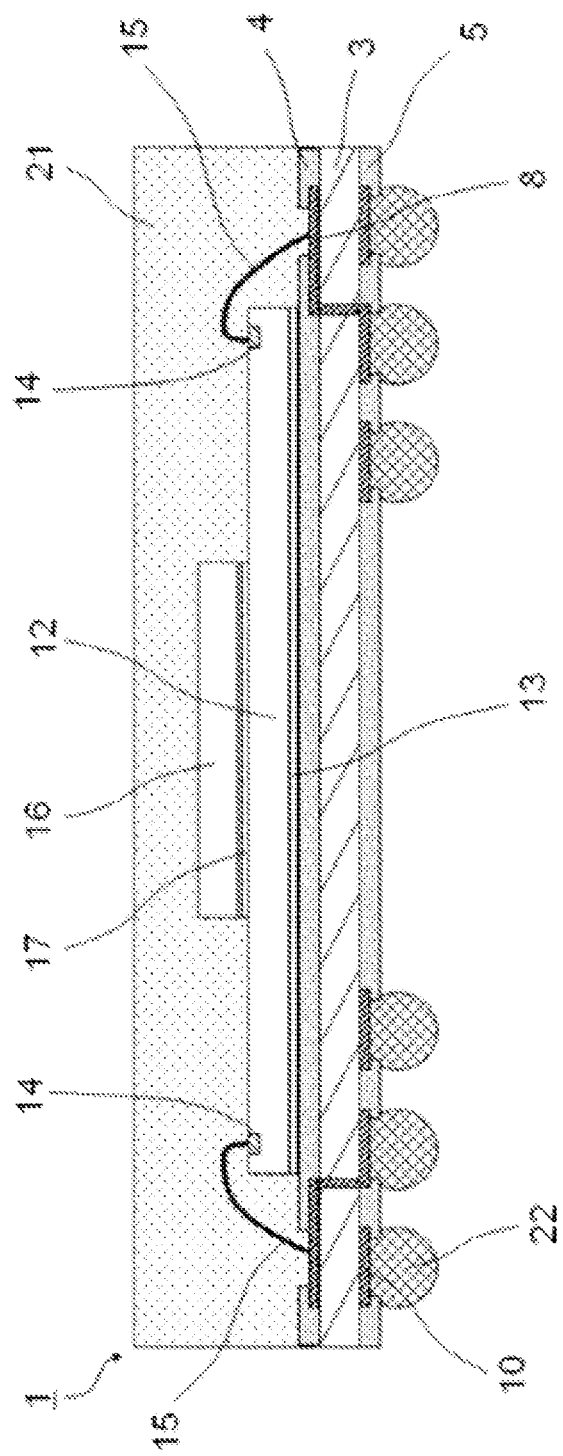

With reference to FIGS. 1, 2A and 2B, a semiconductor device 1 of an MCP (Multi-Chip Package) configuration relating to the present embodiment is provided with a thin wiring substrate 2 having, for example, a substantially rectangular plate shape with a thickness of about 80 µm. The wiring substrate 2 has a predetermined wiring pattern made of copper (Cu) or the like formed on each of the two surfaces of an insulating substrate 3 such as a glass epoxy substrate or the like, and on the upper and lower surfaces on the insulating substrate 3, for example, solder resist (SR: Solder Resist) films 4 and 5 are formed as insulating films. On the solder resist films 4 and 5, openings 6 and 7 are formed. A wiring pattern exposed from the opening 6 of the solder resist film 4 on one surface side of the insulating substrate 3 forms a plurality of first connection pads 8. On the other hand, a wiring pattern exposed from the opening 7 forms a plurality of second connection pads 9. Moreover, a wiring pattern exposed from the opening of the solder resist film 5 on the other surface side forms a plurality of lands 10. The plurality of the lands 10 are, for example, disposed with three rows along the four sides of the wiring substrate, for example, on regions on the outside of the disposed region of the semiconductor chip. The plurality of the first connection pads 8 and the plurality of the second connection pads 9 are electrically connected to the corresponding ones of the plurality of the lands 10 through a predetermined wiring pattern. On the surfaces of the plural first and second connection pads 8 and 9, as well as the plurality of the lands 10, exposed from the openings of the solder resist films 4 and 5, nickel (Ni)/gold (Au) plating, not shown, is formed.

Moreover, in the present embodiment, as shown in FIGS. 1, 2A and 2B, two thick film portions 11, which are formed with a thickness higher than that of the other portions of the solder resist film 4, are formed on the solder resist film 4 of the wiring substrate 2. Each of the thick film portions 11 is configured by stacking two layers of solder resist films, each having a substantially rectangular shape when seen in a plan view, which is formed on the solder resist film 4 by using the same material, and these portions are, for example, formed so as to protrude from the other portions of the solder resist film by a height of 50 µm. The two thick film portions 11 are respectively disposed at positions corresponding to overhanging short sides of a second semiconductor chip 16 to be stacked on the upper stage to be described later, that is, for example, along the opening 6 of the solder resist film 4.

Moreover, on the substantially center region of one surface of the wiring substrate 2, a first semiconductor chip 12, that is, for example, a memory chip of a DRAM (Dynamic Random Access Memory), is mounted, with its rear surface of the memory chip being adhered and secured thereto, by a first adhesion member 13, for example, a DAF (Die Attached Film). The first semiconductor chip 12 has a configuration in which a predetermined memory circuit and a plurality of electrode pads 14 internally connected to the memory circuit are formed on one surface of a silicon substrate having, for example, a substantially rectangular shape. The plurality of the electrode pads 14 are respectively disposed along two short sides that are opposed to each other of the first semiconductor chip 12. The first semiconductor chip 12, which has a thickness of, for example, 40 µm, is mounted with the first adhesion member 13 having a thickness of 10 µm interposed therebetween. The first semiconductor chip 12 is disposed in a manner so as to allow opposing long sides to be opposed to the two thick film portions 11 and spaced away from the thick film portions 11. Moreover, based upon the results of prototypes to be described later, the thick film portions 11 of the wiring substrate 2 are desirably disposed on the solder resist film 4 so as to have a gap G from the first semiconductor chip 12 in a range from 0.4 mm to 0.8 mm.

In this case, each of the thick film portions 11 of the wiring substrate 2 is designed to have the same thickness as a thickness obtained by adding the thickness of the first semiconductor chip 12 and the thickness of the first adhesion member 13 to each other. The thickness of each of the thick film portions 11 is selected on demands in accordance with the thickness of the first semiconductor chip 12 and the thickness of the first adhesion member 13.

Then, each of the electrode pads 14 of the first semiconductor chip 12 and each of the first connection pads 8 of the wiring substrate 2 are electrically connected to each other by a first conductive wire 15 made of gold (Au) or the like.

Moreover, on the first semiconductor chip 12, the second semiconductor chip 16, that is, for example, a memory chip of a DRAM, is stacked and mounted, with its rear surface being adhered and secured thereto by a second adhesion member 17, for example, a DAF. The second semiconductor chip 16, which is, for example, the same memory chip as the first semiconductor chip 12, has a substantially rectangular plate shape, with a plurality of electrode pads 18 being disposed along the two short sides that are opposed to each other. As shown in FIG. 1, the second semiconductor chip 16 is stacked on the first semiconductor chip 12, while being rotated virtually by 90° relative to the first semiconductor chip 12. Moreover, two short sides 19 of the second semiconductor chip 16 are disposed so as to hangover from the first semiconductor chip 12. Furthermore, the two short sides that hangover from the first semiconductor chip 12 of the second semiconductor chip 16 are supported on the thick film portions 11 of the wiring substrate 2, with the second adhesion member 17 being interposed therebetween. The thick film portions 11 are formed so as to be also disposed slightly outside of the overhanging short sides 19 of the second semiconductor chip 16, for example, by about 0.15 mm from the short side 19 of the second semiconductor chip 16, that is, so as to be disposed slightly outside from the overhanging short sides 19 of the second semiconductor chip 16.

Then, each of electrode pads 18 of the second semiconductor chip 16 and each of second connection pads 9 of the wiring substrate 2 are electrically connected to each other by a second conductive wire 20 made of gold (Au) or the like.

Moreover, a sealing resin layer 21 is formed on one of the surfaces of the wiring substrate 2. The first semiconductor chip 12, the second semiconductor chip 16, the plurality of the first wires 15 and the plurality of the second wires 20 are covered with the sealing resin layer 21. The sealing resin layer 21 is composed of, for example, a thermosetting epoxy resin (Epoxy Resin).

Furthermore, on lands 10 disposed on a peripheral region of the other surface of the wiring substrate 2, solder balls 22 forming external electrodes are mounted.

In the semiconductor device 1 of the present embodiment, the thick film portions 11, which are disposed on the solder resist film 4 on one of the surfaces of the wiring substrate 2 so as to be spaced away from the first semiconductor chip 12, are installed so as to support the overhanging short sides 19 of the second semiconductor chip 16 stacked on the second semiconductor chip 12; thus, although not particularly limited thereby, the following effects are obtained.

(1) Since the overhang portion of the second semiconductor chip 16 is supported by each of the thick film portions 11, the electrode pads 18 on the overhang portion of the second semiconductor chip 16 and the second connection pads 9 on the wiring substrate 2 are desirably subjected to applications of ultrasonic waves and loads so that the reliability of wire connections can be improved. Moreover, it becomes possible to prevent chip cracking from occurring at the time of wire bonding of the overhang portion.

(2) By appropriately adjusting the gap between each of the thick film portions 11 and the first semiconductor chip 12, it becomes possible to reduce the occurrence of voids below the overhang portion at the time of molding. Moreover, it is possible to suppress the bending of the second semiconductor chip 16 due to the pressure at the time of molding, thereby making it possible to reduce the occurrence of chip cracking due to the bending.

For example, by setting the gap between each of the thick film portions 11 and the first semiconductor chip 12 in a range of 0.4 mm to 0.8 mm, even in the case of using a general PoP (Package on Package) sealing resin, the sealing resin layer 21 can be formed on the wiring substrate 2, without causing the occurrence of voids and the bending of the second semiconductor chip 16.

(3) Even in the case of an MCP in which the second semiconductor chip 16 overhangs, it becomes possible to use a semiconductor chip having a thin thickness so that a thinner semiconductor device 1 can be obtained.

(4) By forming the thick film portions 11 so as to be disposed slightly outside from the overhanging short sides 19 of the second semiconductor chip 16, it is possible to desirably support the overhang portion even upon occurrence of a slight positional deviation due to the bonding precision of the second semiconductor chip 16.

(5) By providing a configuration in which the overhang portion of the second semiconductor chip 16 is supported by the thick film portions 11 of the insulating film of the wiring substrate 2, the surface for supporting the second semiconductor chip 16 can be formed into a flat surface with a substantially uniform height. Moreover, without causing the adhesion member, under fill or the like of the related art to cover the connection pads, the connection pads can be disposed in the vicinity of the overhang portion.

Next, the following description will discuss an assembling flow chart of the semiconductor device 1 in accordance with the present embodiment. FIGS. 3A-3C and FIGS. 4A-4C are cross-sectional views that exemplify the assembling flow chart of the semiconductor device 1 of the present embodiment.

Figure 3A:
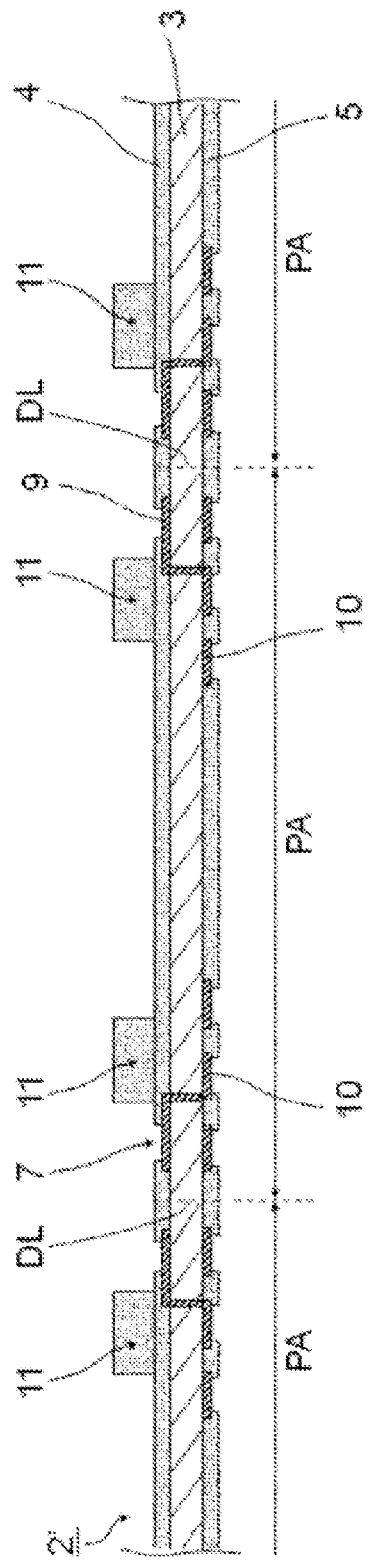
FIGS. 3A to 3C are cross-sectional views (first section thereof) that exemplify assembling flows of the semiconductor device in accordance with the first embodiment.

First, as shown in FIG. 3A, a wiring mother board 2' having a plurality of product areas PA is prepared. The plurality of the product areas PA are portions to form wiring substrates 2 shown in FIGS. 1, 2A and 2B, and the configuration of each of the product areas PA is the same as that of the wiring substrate 2 of FIGS. 1, 2A and 2B. Moreover, as shown in FIG. 3A, the plurality of the product areas PA of the wiring mother board 2' are arranged in a matrix form, and the respective product areas PA are partitioned by a plurality of dicing lines DL. As shown in FIG. 3A, on the solder resist film 4, the thick film portions 11 designed to be thicker than the other portions of the solder resist film 4 are formed.

Figure 3B:
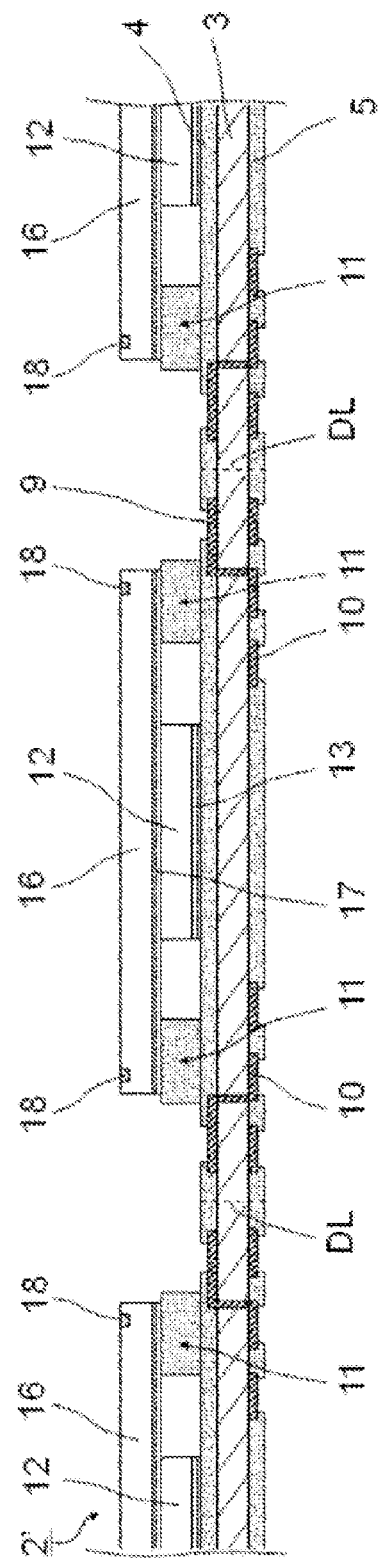

Next, as shown in FIG. 3B, the wiring mother board 2' is transported to a die bonding device, not shown, and by using the die bonding device, the first semiconductor chips 12 are mounted on the product areas PA of the wiring mother board 2'. Each of the first semiconductor chips 12 is mounted so as to make its short side with the electrode pads 14 formed thereon face to face with the opening 6 (see FIG. 1). The first semiconductor chip 12 is adhered and secured onto the wiring mother board 2' by the first adhesion member 13, such as a DAF or the like, formed on the other surface.

Next, by using the die bonding device, the second semiconductor chip 16 is mounted on the first semiconductor chip 12. The second semiconductor chip 16 is stacked on the first semiconductor chip 12, with being rotated by substantially 90° relative to the first semiconductor chip 12 (see FIG. 1), so as to expose the electrode pads 14 of the first semiconductor chip 12 and also to make the overhang portion face to face with the opening 7. In this case, the second semiconductor chip 16 is adhered and secured onto the first semiconductor chip 12 by the second adhesion member 17 such as a DAF or the like. At this time, the short side 19 that overhangs from the first semiconductor chip 12 of the second semiconductor chip 16 is supported by the thick film portions 11. Moreover, the plurality of the electrode pads 14 formed along each of the short sides of the first semiconductor chip 12 are exposed, without being covered with the second semiconductor chip 16 (see FIG. 1). The second semiconductor chip 16 is mounted so as to make its short side with the electrode pads 18 formed thereon face to face with the opening 7 (see FIG. 1).

Figure 3C:
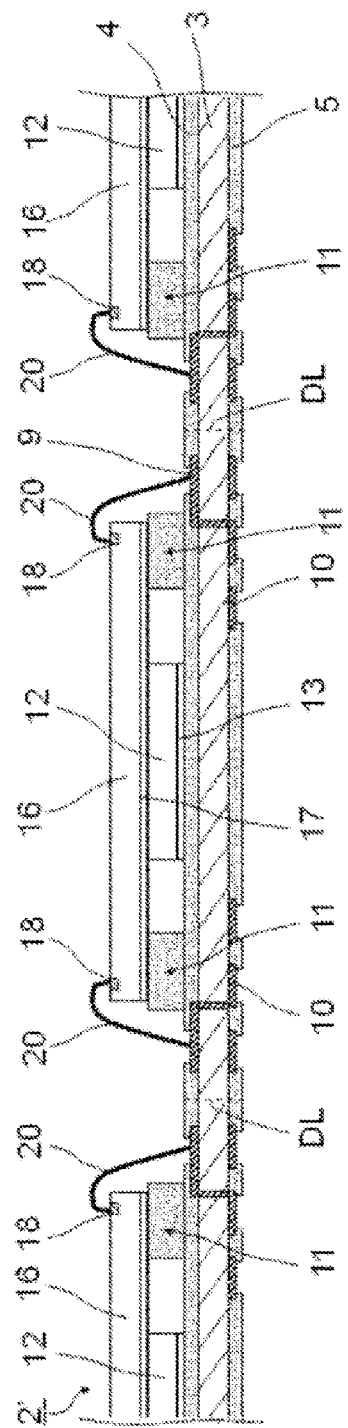

Next, a gap between the electrode pad 14 of the first semiconductor chip 12 and the corresponding first connection pad 8 is electrically connected by a first wire 15 (see FIG. 1), and on the other hand, as shown in FIG. 3C, a gap between the electrode pad 18 of the second semiconductor chip 16 and the corresponding second connection pad 9 is electrically connected by a second wire 20. Upon wire connecting by the first wire 15 and the second wire 20, it is possible to use a wire bonding device, not shown. The wire connection is carried out, for example, by a ball bonding process using an ultrasonic thermal compression bonding method. More specifically, the tip of the first wire 15 with a fused ball formed thereon is ultrasonic thermal compression-bonded onto the electrode pad 14, and the rear end of the first wire 15 is ultrasonic thermal compression-bonded onto the corresponding first connection pad 8 in such a manner as to allow the first wire 15 to form a predetermined loop. In the same manner, the tip of the second wire 20 with a fused ball formed thereon is ultrasonic thermal compression-bonded onto the electrode pad 18, and the rear end of the second wire 20 is ultrasonic thermal compression-bonded onto the corresponding second connection pad 9 in such a manner as to allow the second wire 20 to form a predetermined loop.

At this time, since the overhang portion of the second semiconductor chip 16 is supported by the thick film portion 11, the occurrence of chip cracking can be prevented even in the case when the second semiconductor chip 16 is a comparatively thin chip, thereby making it possible to desirably connect the second wire 20.

Figure 4A:
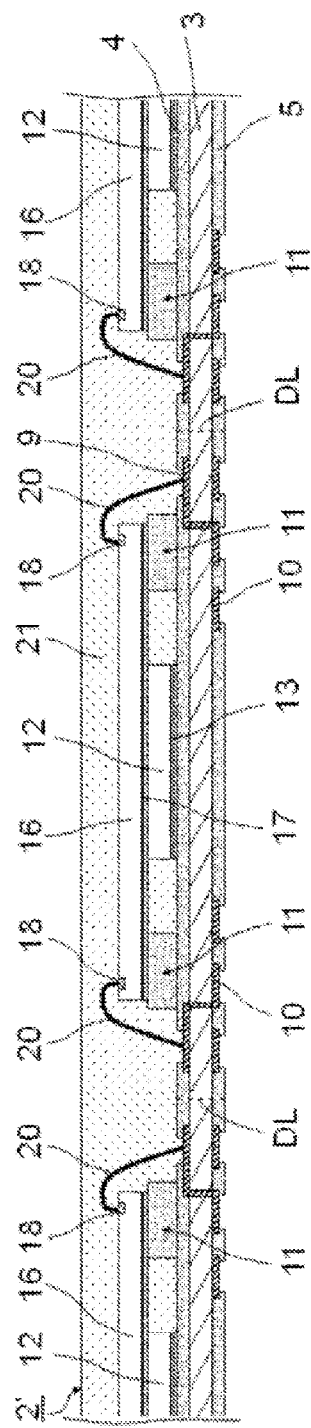
FIGS. 4A to 4C are cross-sectional views (second section thereof) that exemplify assembling flows of the semiconductor device in accordance with the first embodiment.

Next, as shown in FIG. 4A, on one of the surfaces of the wiring mother board 2', a sealing resin layer 21 is formed by an integral molding process, by using a molding device, not shown.

Figure 4B:
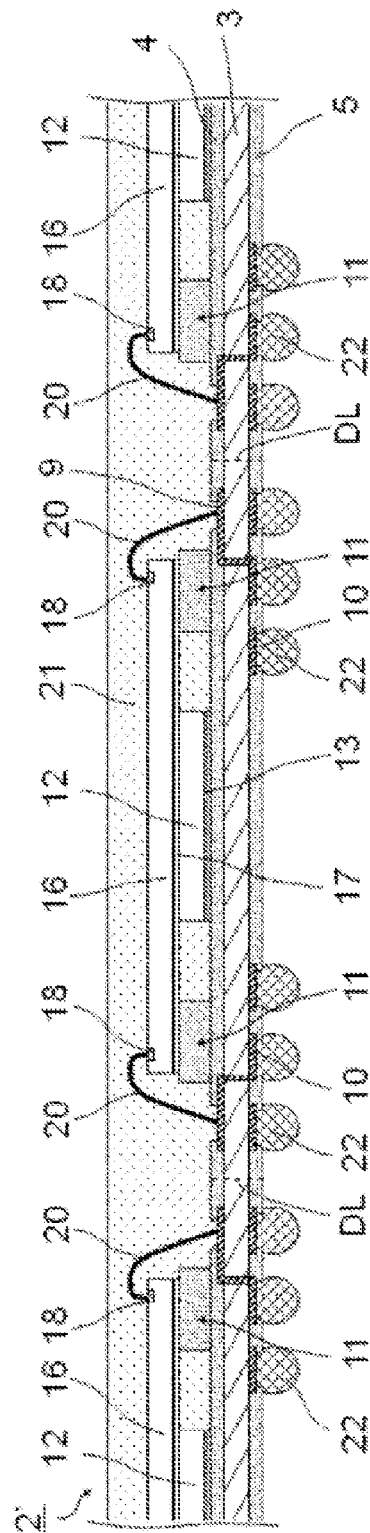
Figure 4C:
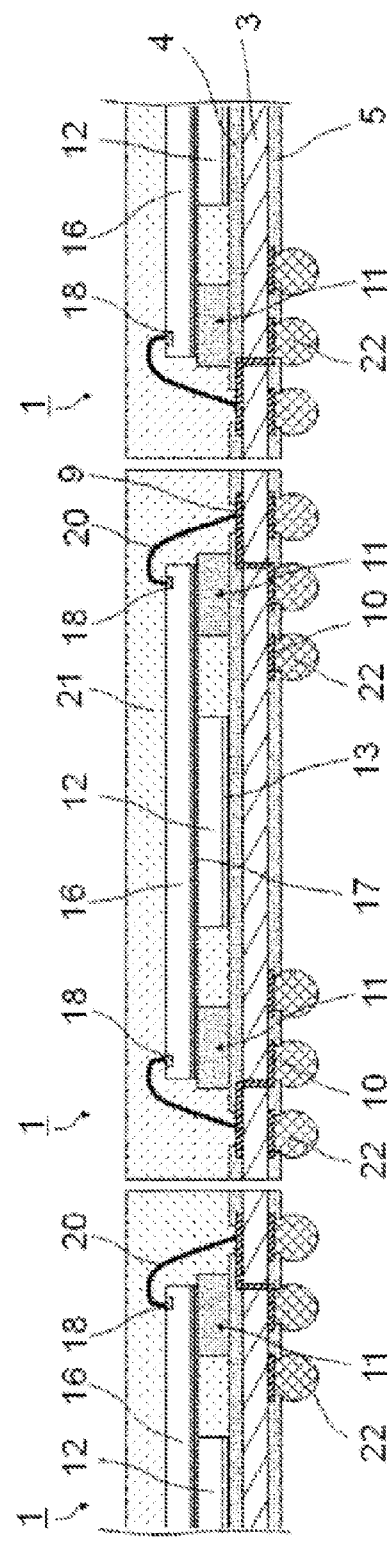

Next, as shown in FIG. 4B, on lands 10 of the other surface of the wiring mother board 2', solder balls 22 are mounted. More specifically, for example, by using a suction mechanism, not shown, with a plurality of suction holes formed thereon in association with the arrangement of the lands 10, the solder balls 22 are held on the suction holes so that the solder balls 22 thus held are integrally mounted on the lands 10 with a flux being interposed therebetween. After the solder balls 22 have been mounted on all the product areas PA, the solder balls 22 are secured thereon by reflowing the wiring mother board 2'.

Next, the sealing resin layer 21 is adhered to a dicing tape, not shown, and the sealing resin layer 21 and the wiring mother board 2' are supported by the dicing tape. Thereafter, by using a dicing blade, not shown, the wiring mother board 2' and the sealing resin layer 21 are cut longitudinally as well as laterally along dicing lines DL. Thus, the wiring mother board 2' is divided into individual pieces for each of the product areas PA. Thereafter, by picking up the product areas and sealing resin layer 21 divided into individual pieces from the dicing tape, the semiconductor device 1 as shown in FIGS. 1, 2A and 2B can be obtained.

Figure 6A:
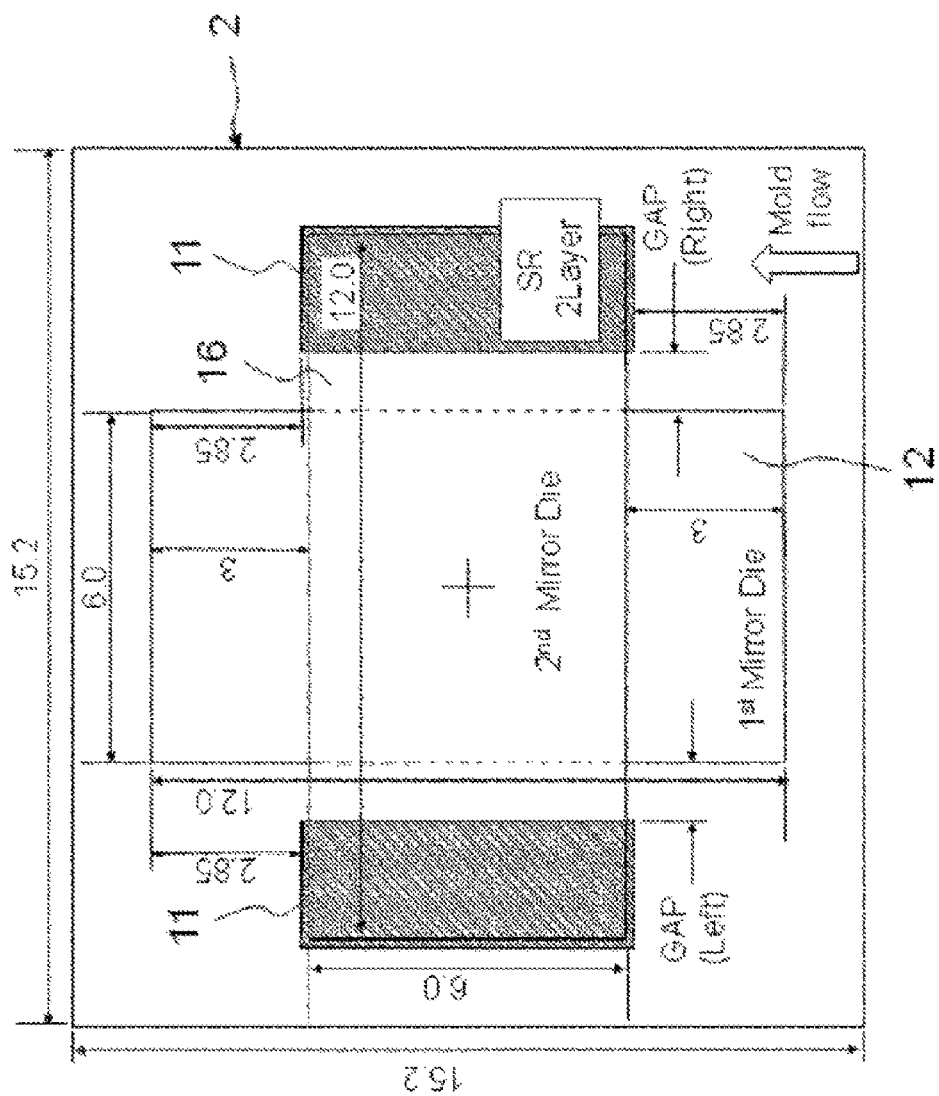
FIGS. 6A to 6C are views and a table that show a configuration of the prototype of the semiconductor device in accordance with the first embodiment.
Figures 6B, 6C:
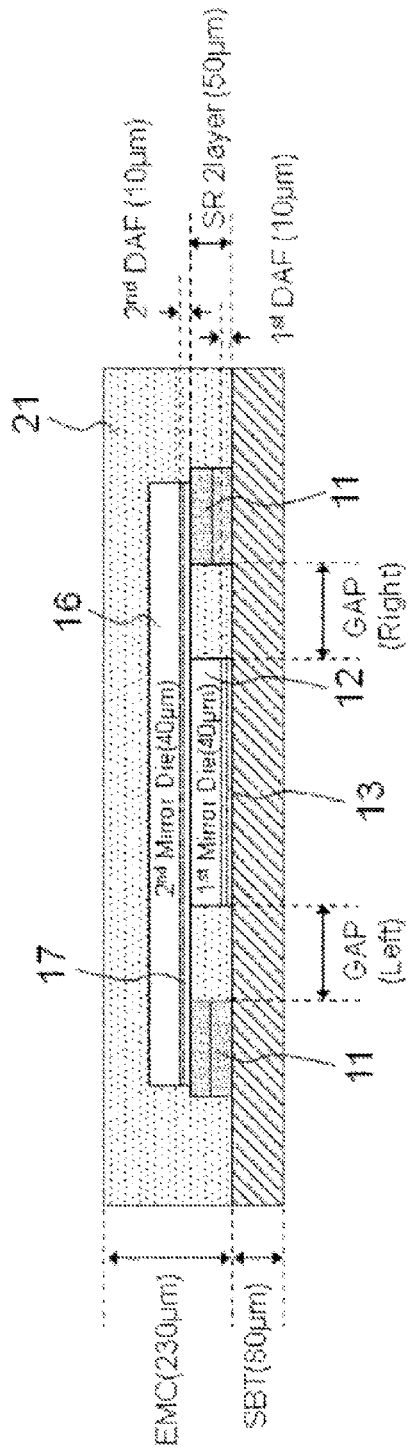

The following description will discuss the results of applications of prototypes used for examining the effects of the semiconductor device 1 of the present embodiment. FIGS. 5A and 5B are tables used for indicating the results of prototypes of the semiconductor device 1 of the present embodiment. FIGS. 6A, 6B and 6C are views and a table showing configurations of the prototypes. FIG. 7 is a table showing characteristics of materials and sealing resins (EMC: Epoxy Molding Compound) used for the prototypes.

In order to examine the effects of the semiconductor device of the present embodiment, by using the configurations of FIGS. 6A, 6B and 6C and materials shown in FIG. 7, prototypes of the semiconductor device are assembled, with the gap between the thick film portion 11 and the first semiconductor chip 12 being varied within a range from 0.2 mm to 2.0 mm. Additionally, as the sealing resin for the sealing resin layer 21, three types of resins generally used for PoP (Package on Package) are used.

Moreover, in the prototypes, the wire connecting property that causes a problem with the overhang portion and the chip cracking that causes a problem at the time of wire bonding are solved by installing the thick film portion 11 for supporting the overhang portion; therefore, two mirror chips are mounted thereon, and the sealing process is carried out without executing a wire bonding process.

Furthermore, in the prototypes, the occurrence of voids in the sealing resin at the gap between the overhang portion of the second semiconductor chip 16 and the wiring substrate 2, which might be caused by installing the thick film portion 11 on the wiring substrate 2, and the occurrence of a concave portion or cracking in the overhang portion of the second semiconductor chip 16, which might be caused by making the chip thickness of the second semiconductor chip 16 thinner, are confirmed. The tables of FIGS. 5A and 5B indicate a rate of the number of defective products/the number of samples.

As shown by an arrow in FIG. 6A, the sealing resin is injected by using a transfer compression molding process along a direction in which the gap between the thick film portion 11 and the first semiconductor chip 12 is extended.

FIG. 5A shows the results of examinations carried out on the generation of voids below the overhang of the second semiconductor chip 16 in each of the prototypes. On the other hand, FIG. 5B shows the results of examinations carried out on the generation of a concave portion or cracking in the overhang of the second semiconductor chip 16 in each of the prototypes. Additionally, evaluations were carried out on the overhang of one of the two sides of overhangs. The gap width of FIGS. 5A and 5B represents a distance between the first semiconductor chip 12 and the thick film portion 11 below the overhang on the side that has been evaluated.

As the results of the prototypes shown in FIG. 5A and FIG. 5B, a desired result was obtained even in a range of the gap width of 0.4 mm to 1.0 mm in one portion of the sealing resin (Resin A). However, in common with the three types of resins generally used for PoP (Resin A, Resin B and Resin C), a result that solves both of problems of the occurrence of voids and a concave portion of the chip can be obtained by setting the gap width within a range from 0.4 mm to 0.8 mm is obtained. Therefore, it is desirable to dispose the thick film portion 11 of the wiring substrate 2, while being spaced from the first semiconductor chip 12 with a gap in the range from 0.4 mm to 0.8 mm. By using this configuration, it is possible to prevent the occurrence of voids as well as the occurrence of a concave portion and cracking in the overhang portion of the second semiconductor chip 16.

Embodiment 2

Figure 8:
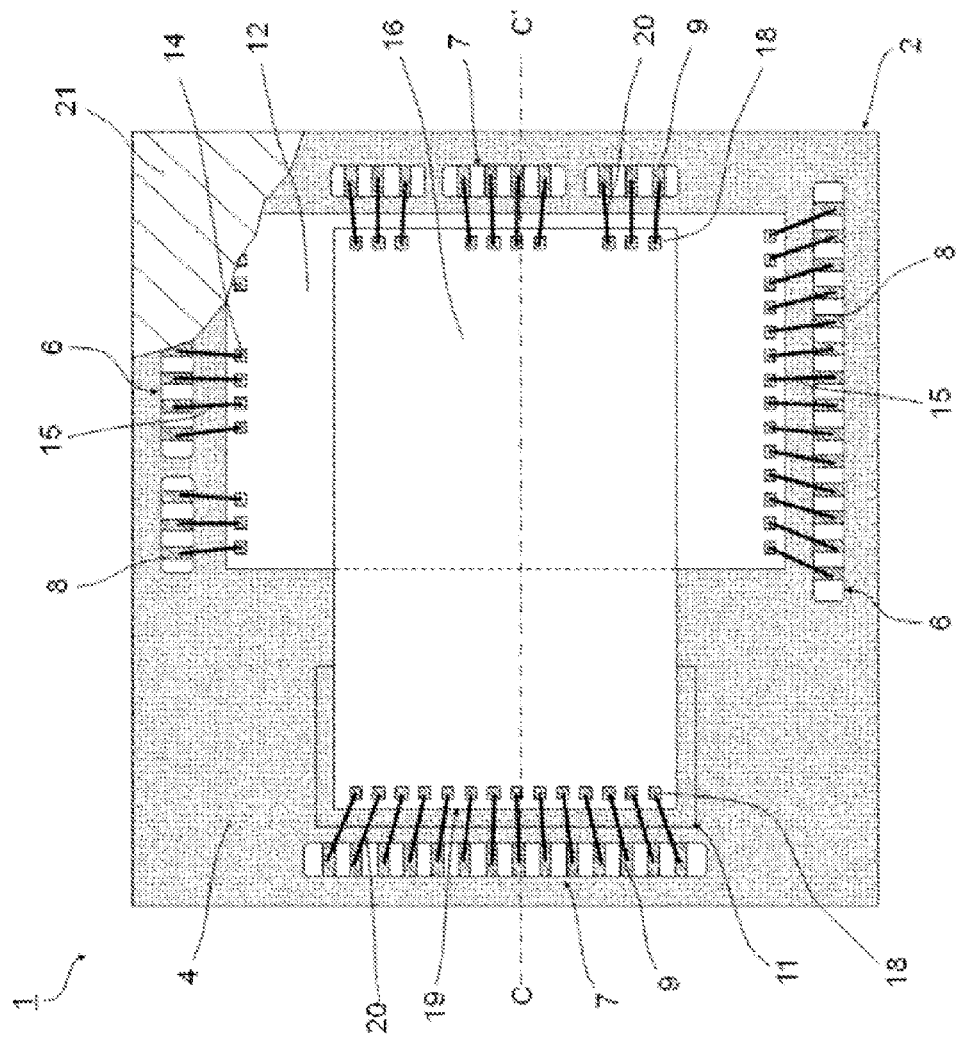
FIG. 8 is a plan view that exemplifies a schematic configuration of a semiconductor device in accordance with a second embodiment.
Figure 9:
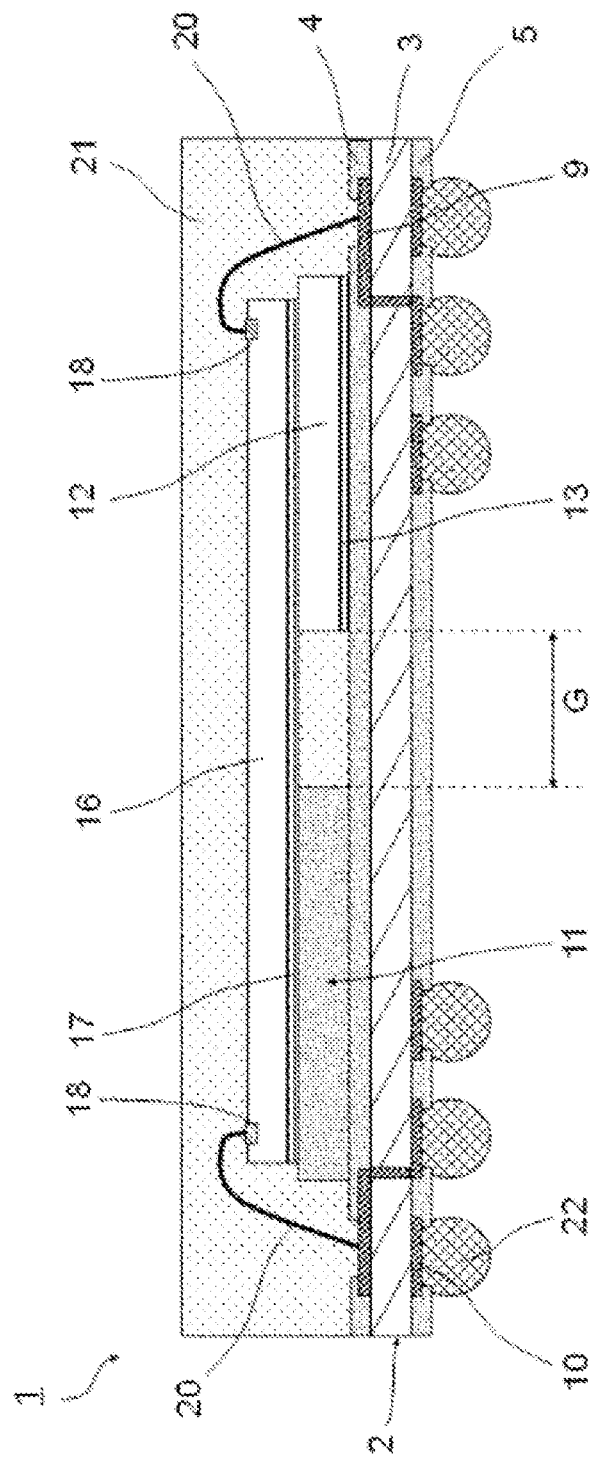
FIG. 9 is a cross-sectional view (taken along C-C') that exemplifies the schematic configuration of the semiconductor device in accordance with the second embodiment.

Referring to FIGS. 8 and 9, the following description will discuss a semiconductor device in accordance with a second embodiment in detail. FIG. 8 is a plan view showing a schematic configuration of a semiconductor device 1 in accordance with the present embodiment. FIG. 9 shows a cross-sectional view that indicates a cross-sectional configuration taken between C-C' of FIG. 8.

The semiconductor device 1 relating to the present embodiment is configured in the same manner as in the semiconductor device (see FIGS. 1, 2A and 2B) of the first embodiment. However, as shown in FIGS. 8 and 9, the semiconductor device 1 of the present embodiment is different from the semiconductor device relating to the first embodiment in that the first semiconductor chip 12 is disposed so as to be shifted toward one of the short sides of the second semiconductor chip 16, and in that only one of the short sides 19 of the second semiconductor chip 16 is overhanged, with the overhang portion of the second semiconductor chip 16 being designed to be supported by a single thick film portion 11 of the wiring substrate 2.

Additionally, as shown in FIG. 9, the thick film portion 11 is desirably adjusted so that the gap G between the thick film portion 11 of the wiring substrate 2 and the first semiconductor chip 12 is set in a range from 0.4 mm to 0.8 mm. Moreover, the thick film portion 11 is desirably formed so as to be also disposed slightly outside of the short side 19 of the semiconductor chip 16 by about 0.15 mm so that it is disposed slightly outside of the overhanging short side 19 of the second semiconductor chip 16.

In the semiconductor device 1 in accordance with the present embodiment also, the same effects as those of the semiconductor device of the first embodiment are obtained. Moreover, in accordance with the semiconductor device 1 relating to the present embodiment, since only one overhang portion is formed, the risk of occurrence of voids under the overhang portion can be further reduced in comparison with the semiconductor device in accordance with the first embodiment.

Embodiment 3

Figure 10:
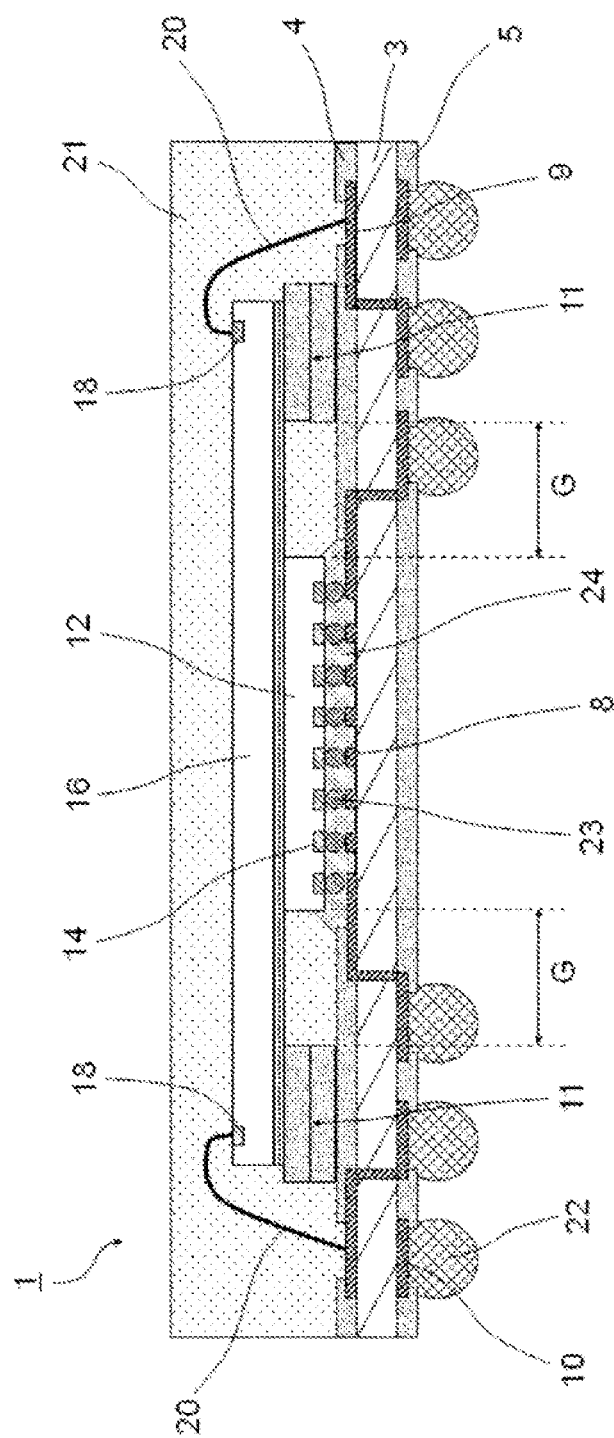
FIG. 10 is a cross-sectional view that exemplifies a schematic configuration of a semiconductor device in accordance with a third embodiment.

Next, referring to FIG. 10, the following description will discuss a semiconductor device in accordance with a third embodiment. FIG. 10 is a cross-sectional view showing a schematic configuration of a semiconductor device 1 in accordance with the present embodiment.

The semiconductor device 1 relating to the present embodiment is configured in the same manner as in the semiconductor device (see FIGS. 1, 2A and 2B) of the first embodiment. However, as shown in FIG. 10, the semiconductor device 1 of the present embodiment is different from the semiconductor device relating to the first embodiment in that bump electrodes 23 are formed on the electrode pads 14 of the first semiconductor chip 12 so that the first semiconductor chip 12 is flip-chip assembled on the first connection pads 8 of the wiring substrate 2, with the bump electrodes 23 interposed therebetween.

The thick film portion 11 is desirably adjusted so that the gap G between the thick film portion 11 of the wiring substrate 2 and the first semiconductor chip 12 is set in a range from 0.4 mm to 0.8 mm. Moreover, the height of the thick film portion 11 measured based upon the insulating substrate 3 corresponds to a height obtained by adding the thicknesses of the first semiconductor chip 12 and the under fill material 24 to each other. The thickness of the thick film portion 11 is appropriately selected in accordance with the thicknesses of the first semiconductor chip 12 and the under fill material 24.

In the semiconductor device 1 in accordance with the present embodiment also, the same effects as those of the semiconductor device of the first embodiment are obtained. Moreover, in accordance with the semiconductor device 1 relating to the present embodiment, the thick film portion 11 is disposed between the first semiconductor chip 12 and the second connection pad 9 of the wiring substrate 2; therefore, even in the case when the under fill material 24, which is placed between the first semiconductor chip 12 and the wiring substrate 2, protrudes externally, the risk of the under fill material 24 covering the second connection pad 9 can be reduced.

In the foregoing description, explanations have been given based upon the embodiments of the invention made by the present inventors; however, the present invention is not intended to be limited by the above-mentioned embodiments, and it is needless to say that various modifications may be made therein within a scope not departing from the gist of the present invention. For example, in the above-mentioned embodiments, explanations have been given by exemplifying a structure in which two memory chips having the same configuration are mounted; however, the present invention may be applied to a structure in which two semiconductor chips having different structures, such as a DRAM and a Flash memory chip or the like, or a memory chip and a logic chip or the like, are mounted on a wiring substrate.

In the above-mentioned embodiment, explanations have been given to a structure in which the thick film portion is constituted by two layers of solder resist; however, one layer, or three or more layers of solder resist may be used as long as the same height as that of the surface of the first semiconductor chip is maintained.

It is supposed that the contents of the entire disclosure of the above-mentioned Patent Documents are incorporated and described in the present specification as quoted descriptions. Within the scope of the entire disclosure (including claims) of the present invention, based upon its basic technical idea, various changes and adjustments of the embodiments may be made therein. Moreover, within the scope of the entire disclosure of the present invention, various kinds of combinations or selections of various disclosing elements (including respective elements of respective claims, respective elements of respective embodiments, and respective elements of respective drawings, etc.) may be made therein. That is, it is needless to say that various changes and modifications that those skilled in the art would arrive at in accordance with the entire disclosure including the claims and the technical idea are included within the scope of the present invention. In particular, with respect to numeric value ranges described in the present specification, those desired numeric values or smaller ranges included in the corresponding range should be construed as being specifically described unless otherwise specified.

What is claimed is:

1. A semiconductor device comprising:
   a substrate including a first surface and a second surface opposite to the first surface;
   a first layer formed over the first surface, the first layer being a solder resist material;
   a second layer thicker than the first layer formed over a first portion of the first layer, the second layer being the same solder resist material as the first layer;
   a first semiconductor chip mounted over a second portion of the first layer; and
   a second semiconductor chip commonly mounted over the first semiconductor chip and the second layer, wherein the second semiconductor chip is rectilinear and has opposing first sides and opposing second sides, wherein the second layer has a continuous length that is longer than the length of a first side of the second semiconductor chip, and wherein the second layer extends laterally outside at least one of the first and/or second sides of the second semiconductor chip.

2. The semiconductor device as claimed in claim 1, further comprising a fourth layer formed over the second surface of the substrate, the fourth layer being formed of the same solder resist material.

3. The semiconductor device as claimed in claim 1, wherein a surface of the second layer is substantially equal in height to an upper surface of the first semiconductor chip.

4. The semiconductor device as claimed in claim 1, wherein the second semiconductor chip includes a plurality of electrode pads thereon, and
   the electrode pads of the second semiconductor chip are vertically aligned with the second layer.

5. The semiconductor device as claimed in claim 4, wherein the substrate includes a plurality of connection pads thereon, and each of the electrode pads of the second semiconductor chip is coupled to an associated one of the connection pads of the substrate via a bonding wire.

6. The semiconductor device as claimed in claim 5, wherein the first semiconductor chip includes a plurality of electrode pads and a plurality of bumps formed on the electrode pads, the electrode pads of the first semiconductor chip are coupled to the connection pads via the bumps.

7. The semiconductor device as claimed in claim 1, wherein the substrate includes a third layer formed over a third portion of the first layer that is thicker than the first layer, the second portion is sandwiched between the first portion and the third portion, and the second semiconductor chip is commonly mounted over the first semiconductor chip, the second layer and the third layer.

8. The semiconductor device as claimed in claim 1, wherein the first semiconductor chip is mounted over the first portion via an adhesive and the first layer, and
a height of the second layer protruding from the first layer is substantially equal to a thickness of the sum of the first semiconductor chip and the adhesive.

9. A semiconductor device comprising:
a substrate including an insulating base and an insulating film formed on the insulating base, the insulating film including an inner portion and a thick film portion that is thicker than the inner portion of the insulating film, wherein the inner portion is formed from a solder resist material and the thick film portion is formed from the same solder resist material as the inner portion;
a first semiconductor chip mounted over the substrate, the first semiconductor chip being apart from the thick film portion of the insulating film;
a second semiconductor chip stacked over the first semiconductor chip and the thick film portion of the insulating film, wherein the second semiconductor chip has a rectangular shape including opposing short sides and opposing long sides, wherein the thick film portion has a continuous length that is longer than the length of a short side of the second semiconductor chip, and wherein the thick film portion extends laterally outside at least one of the sides of the second semiconductor chip; and
a sealing layer provided over the substrate to cover the first and second semiconductor chips.

10. The semiconductor device as claimed in claim 9, wherein a gap between the first semiconductor chip and the thick film portion of the insulating film is in a range from 0.4 mm to 0.8 mm.

11. The semiconductor device as claimed in claim 9, wherein a surface of the thick film portion is substantially equal in height to an upper surface of the first semiconductor chip.

12. The semiconductor device as claimed in claim 9, wherein the second semiconductor chip includes a plurality of electrode pads thereon, and the electrode pads of the second semiconductor chip are vertically aligned with the thick film portion of the insulating film.

13. The semiconductor device as claimed in claim 12, wherein the substrate includes a plurality of connection pads formed on the insulating base, and each of the electrode pads of the second semiconductor chip is coupled to an associated one of the connection pads of the substrate via a bonding wire.

14. The semiconductor device as claimed in claim 13, wherein the first semiconductor chip includes a plurality of electrode pads thereon, each of the electrode pads of the first semiconductor chip is coupled to an associated one of the connection pads via a bonding wire.

15. The semiconductor device as claimed in claim 13, wherein the first semiconductor chip includes a plurality of electrode pads and a plurality of bumps formed on the electrode pads, and the electrode pads of the first semiconductor chip are coupled to the connection pads via the bumps.

16. The semiconductor device as claimed in claim 9, wherein the thick film portion includes a first and second thick film portions, the first semiconductor chip is mounted over a portion between the first and second thick film portions.

17. The semiconductor device as claimed in claim 16, wherein the second semiconductor chip is stacked over the first semiconductor chip and the first and second thick film portions.

18. A method of manufacturing a semiconductor device, the method comprising:
preparing a substrate which includes a first surface, a second surface opposite to the first surface, a first portion formed on the first surface, a second portion thicker than the first portion formed on the first surface, a third portion formed on the second surface, the first portion being formed of a solder resist material, and each of the second and third portions being formed of the same solder resist material as the first portion;
mounting a first semiconductor chip over the first portion of the substrate apart from the second portion; and
commonly mounting a second semiconductor chip over the first semiconductor chip and the second portion, wherein the second semiconductor chip has a rectangular shape including opposing short sides and opposing long sides, wherein the second portion has a continuous length that is longer than the length of a short side of the second semiconductor chip, and wherein the second portion extends laterally outside at least one of the sides of the second semiconductor chip.

* * * * *